United States Patent
Goh

(10) Patent No.: US 8,928,381 B1
(45) Date of Patent: Jan. 6, 2015

(54) SPARE CELL STRATEGY USING FLIP-FLOP CELLS

(71) Applicant: STMicroelectronics Asia Pacific Pte. Ltd., Singapore (SG)

(72) Inventor: Beng-Heng Goh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 13/940,713

(22) Filed: Jul. 12, 2013

(51) Int. Cl.
  *H03K 3/037* (2006.01)
  *H03K 19/00* (2006.01)

(52) U.S. Cl.
  CPC .................................... *H03K 3/037* (2013.01)
  USPC ................. 327/225; 326/38; 326/46

(58) Field of Classification Search
  None
  See application file for complete search history.

(56) References Cited

U.S. PATENT DOCUMENTS

2002/0075058 A1* 6/2002 Hwang et al. ................. 327/407
2011/0289372 A1* 11/2011 Tang et al. .................... 714/731

* cited by examiner

*Primary Examiner* — Lincoln Donovan
*Assistant Examiner* — Terry L Englund
(74) *Attorney, Agent, or Firm* — Gardere Wynne Sewell LLP

(57) ABSTRACT

Configurable flip-flop cells for use in scan chain configurations include one or more multiplexers, a flip-flop, and one or more logic gates. The logic gates are configurable, through modification of different metallization or semiconductor layers, to operate as spare gates or to disable flip-flop cell outputs based selection signal switching between scan shift and capture mode. When disabling flip-flop cell outputs, the logic gates are configured to receive both a test signal and a data input signal and select one of the two to pass to the flip-flop based on the selection signal. When used as spare gates, the logic gates receive external inputs and provide spare gate outputs to circuitry on an integrated circuit that is external to the flip-flop cells.

20 Claims, 4 Drawing Sheets

SPARE CELL STRATEGY USING FLIP-FLOP CELLS

BACKGROUND

Standard cell application-specific integrated circuits (ASICs) provide a number of significant advantages over other types of integrated circuits, including more manageable die size, lower piece-part cost, higher performance, and more reliable design flow. The standard cell approach is generally preferred to other competing approaches such as custom design and programmable logic. Yet, this approach typically has high non-recurring expense (NRE) and process cycle time for development of a given integrated circuit (IC) design. The principal components of the NRE are the cost of a new lot start and the cost of a new mask set as required to implement changes in a standard cell design. As transistor technology shrinks in size, the lot start and mask set costs can increase considerably. With regard to process cycle time, ASICs typically undergo several design iterations before full production. Final production with pure standard cell technology can thus be expensive and time consuming at a time when market forces are squeezing costs and shortening development cycles.

One technique for reducing the NRE and process cycle time involves the embedding of spare standard cell gates in a chip netlist to be used at a later time for design changes or to fix inevitable bugs. These spare cells typically include some kind of NAND and NOR gates as well as multiplexers, inverters, and flip-flops that are hopefully useful for design changes and debugging. Traditionally, the spare cells are distributed across an IC in a limited manner (e.g., one spare gate for every 100 flip-flops). Wiring changes and debugging using spare cells can be difficult due to poor spare cell placement, because the spare cells may not be close to the point where their spare logic is needed.

Another way to debug an IC is through the use of a scan chains. Scan chain chains are widely used to efficiently test the logic of different designs on a chip. An effective scan chain test can detect a high percentage of manufacturing failures and greatly reduce the amount time and data necessary to ensure a particular chip design is working properly. Scan chains typically operate in two modes: (1) a scan shift mode; and (2) a capture, or functional, mode. In the scan shift mode, a test value is shifted into serially connected flip-flops of the scan chain. In capture mode, the flip-flops are allowed to function properly by passing data to combinational logic of a design under test (DUT) and receiving signals from the DUT as inputs to the next sequential flip-flop in the scan chain. Testing occurs by first shifting the test value into the flip-flops during scan shift mode and then supplying the test value to the DUT during capture mode to see how the DUT responds. The final flip-flop in the chain produces an output value that can be compared against what should have been produced by the DUT, and if the two do not match, the testing strongly indicates there is a flaw or bug in the DUT.

A D flip-flop has a single data input, a reset input, a clock input, and multiple flip-flop outputs. Upon detection of a particular clock action (e.g., a rising edge), a D flip-flop is designed to assign the value of the data input to a standard function output and a test output. In a scan chain using D flip-flops, the standard function output of each D flip-flop is connected to circuitry of the DUT, and the test output of each D flip-flop is connected to the test input of the next flip-flop in the chain. During capture mode, the test output of the D flip-flop does not matter while the standard function output does because the latter is supplying data values to circuitry of the DUT. Conversely, in scan shift mode, the standard function output of the D flip-flop does not matter while the test output does because the latter is being used to shift in the test value. Even though one of the two D flip-flop outputs do not matter at any given time, signals are still being sent across both outputs. Power is required to switch these unnecessary signals of the two D flip-flop outputs, and this unnecessary signal switching is wasteful for at least one flip-flop output at any given time—not only for the power required to switch the output but also for downstream electrical activity in the IC that may be affected by the unnecessary output.

SUMMARY

This Summary is provided to introduce a selection of concepts in a simplified form that are further described below in the Detailed Description. This Summary is not intended to identify key or essential features of the claimed subject matter, but instead is provided to illustrate different embodiments.

One aspect is directed to a flip-flop cell that internally includes a multiplexer, flip-flop, a NOR gate, and a NAND gate. The flip-flop cell has four inputs: a data input, a test input, a scan enable input, and a clock input. The data input and test input are coupled to the multiplexer as inputs, and the enable signal input is coupled to the multiplexer as a selector. The multiplexer passes either the data input signal or the test input signal to an internal data input of a D flip-flop, based on the scan enable signal signaling a capture mode or scan shift mode. The scan enable signal is set to one state (e.g., zero or low) to place the flip-flop cell into capture mode and set to the other logic state (e.g., one or high) to place the flip-flop logic cell into scan shift mode. Capture mode represents a configuration where the data input passed to the multiplexer is supplied to the internal data input of the flip-flop and thereafter transmitted to the internal output of the flip-flop after a particular clock event, such as a rising or falling clock edge. Conversely, scan shift mode instructs the multiplexer to send the test input to the internal data input of the flip-flop, resulting in the test input being transmitted to the flip-flop's internal output at the next clock event.

One aspect is directed to replicable a flip-flop cell including a multiplexer configured to receive a data input, a test input, and a selection signal and provide a multiplexed output; a flip-flop configured to generate an internal data signal based on the multiplexed output and a clock signal; and a configurable logic gate. By modifying different metallization and/or semiconductor layers of the IC, the configurable logic gate in the flip-flop cell can be wired as either a normal-functioning logic gate or a spare logic gate. When hardwired as a normal-functioning logic gate, the flip-flop cell output is set to a fixed logic value if the selection signal is set to a first logic state and permitted to change state in response to said internal data signal if the selection signal is set to a second logic state. As a spare logic gate, the gate is configure to receive inputs from circuitry external to the flip-flop cell and generate a spare gate output in response to the one or more inputs from the circuitry external to the flip-flop cell.

Another aspect is directed to an IC with at least two replicate flip-flop cells. A Each replicate flip-flop cell includes a multiplexer configured to receive a data input, a test input, and a selection signal and provide a first multiplexed output. The replicate flip-flop cells are also configured to generate a internal data signals based on the first multiplexed output and a clock signal. One of the replicate flip-flop cells includes a logic gate configured to generate a flip-flop cell output in response to the internal data signal and the selection signal. The flip-flop cell output is set to a fixed logic value if the selection signal is set to a one logic state and permitted to change state in response to the flip-flop cell's internal data signal if the selection signal is set to a second logic state. The other replicate flip-flop cell includes a spare logic gate configured to receive one or more inputs from circuitry external to the replicate flip-flop cell and generate a spare gate output in response to the one or more inputs from the external. In one embodiment, the two replicate flip-flop cells include the same logic gates, but these gates are hardwired to function as in the above two manners—i.e., normally internal signals to flip-flop cell outputs or as spare gates—through differences in configurable metallization layers of the IC. This makes the logic gates configurable logic gates at the time of manufacturing.

Another aspect is directed to a flip-flop cell that internally includes two multiplexers, a flip-flop, and a NOR gate. The flip-flop cell has four inputs: a data input, a test input, a scan enable input, and a clock input. The data input and test input are coupled to the multiplexer as inputs, and the enable signal input is coupled to the multiplexer as a selector. The multiplexer passes either the data input signal or the test input signal to an internal data input of a D flip-flop based on the scan enable signal signaling a capture mode or scan shift mode. The NOR gate generates a standard function flip-flop cell output based on the scan enable signal and an internal output of the D flip-flop. The second multiplexer produces the test flip-flop cell output based on the internal D flip-flop output and an inversion of the scan enable signal.

Still another aspect is directed to a scan test configuration design with multiple flip-flop cells connected in series together such that their test flip-flop cell outputs are connected to the test inputs of the next flip-flop in the chain. The scan chain may use either of the aforesaid new flip-flop cell outputs or a combination thereof. In one embodiment, the test flip-flop cell output of the final flip-flop in the chain is provided to peripheral circuitry, logic, or memory for evaluation. Some or all of the flip-flop cells in the scan chain may include spare inputs that are exposed to circuitry of an IC.

Still another aspect is directed to an IC having a plurality of metallization layers and a plurality of replicate flip-flop cells that each include a multiplexer, a flip-flop, a logic gate, and a flip-flop cell output. The IC includes permanent wiring through modifying the metallization layers to connect, in each of the replicate flip-flop cells, the multiplexer to the flip-flop and the internal output of the flip-flop to the logic gate. The IC also includes configurable wiring, implemented in the metallization layers, configured to connect logic gates in the flip-flop cells differently depending on whether the gates are used in a normal-functioning manner or as spare gates. When normally functioning, an internal output of the flip-flops in the flip-flop cell is connected to an input of the logic gate and an output of the logic gate is supplied as the flip-flop cell output. As spare gates, external circuitry is directly wired to the spare logic gate an a spare gate output is provided back out to external circuitry.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

BRIEF DESCRIPTION OF DRAWINGS

Embodiments are illustrated by way of example in the accompanying figures wherein.

DETAILED DESCRIPTION

Figure 1A:
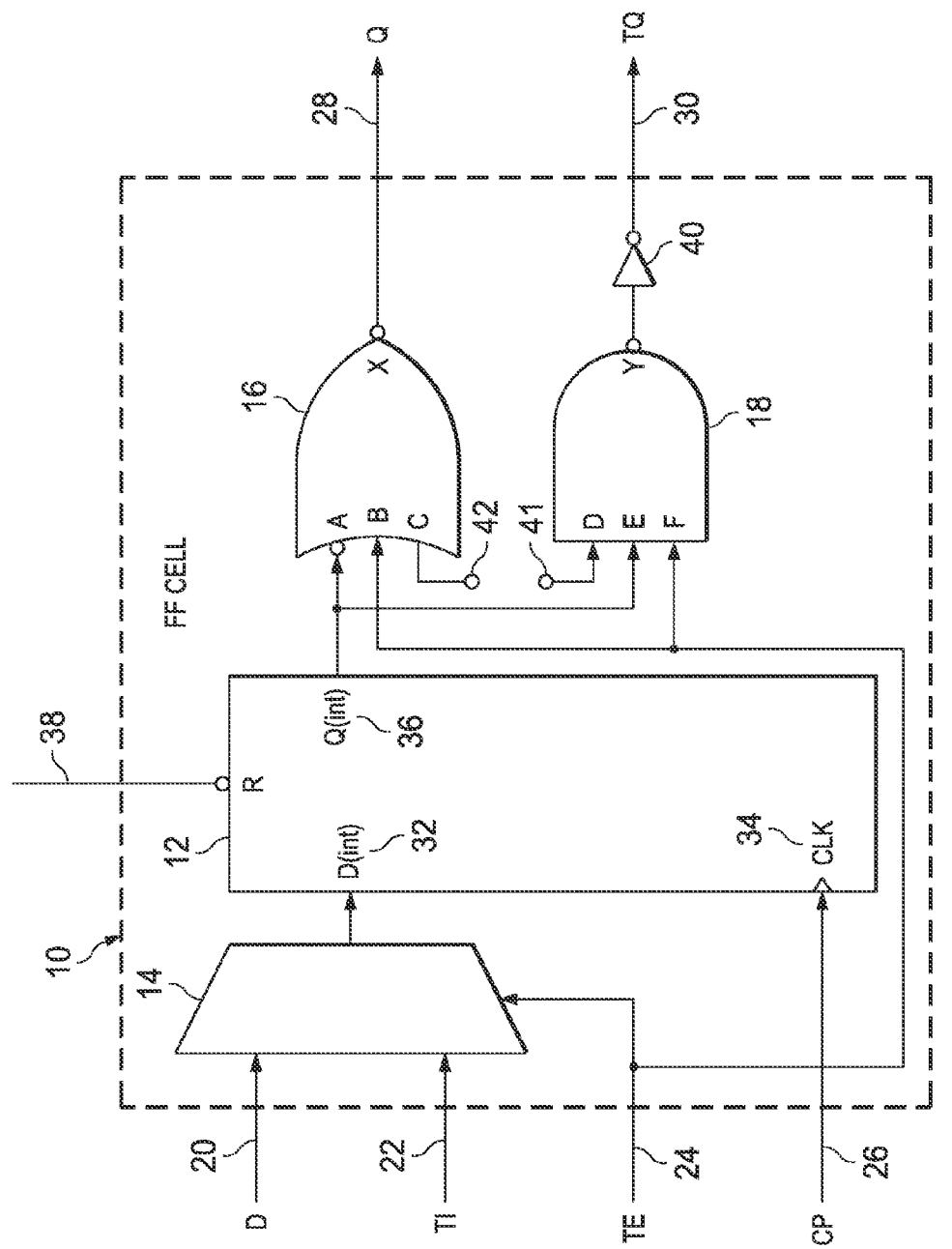
FIG. 1A illustrates a detailed representation of a flip-flop cell.

A scan chain uses several flip-flop cells connected in series to each other and is configured to operate in two different modes: (1) a functional mode (referenced herein as "capture mode"), and (2) and a test mode (referenced herein as the "scan shift mode"). In the scan shift mode, the flip-flop cells in the scan chain series are configured to shift in a test value one bit at a time, and each flip-flop cell supplies a test output to the next flip-flip cell in the scan chain series. Once the test value has been shifted into the flip-flop cells, the flip-flops are switched to the capture mode during which testing of the DUT can be performed by passing the test value to the DUT through the flip-flop cells. In capture mode, data input signals from the DUT are received at one or more of the flip-flop cells, passed to a standard function flip-flop cell output, and that standard function cell output is supplied to other circuitry in the DUT. The rest of the flip-flop cells are similarly connected, creating a connection path through the DUT and all the flip-flop cells, and an output of the final flip-flop cell in the scan chain can be analyzed to determine how the logic and circuitry of the DUT is operating.

One aspect of embodiments described herein generally relates to new flip-flop cells that reduce overall switching current and power consumption when used in a scan chain test configuration and that provide spare gates that can be easily used by other circuitry in an IC. The flip-flop cells disable a standard function flip-flop cell output when a scan enable input signal places the flip-flop cell into a scan shift mode and disable a test flip-flop cell output when the flip-flop cell is placed in a capture mode. Another aspect relates to new flip-flop cells that provide logic gates and combination logic as spare gates that logic and circuitry external to the flip-flop cells can use for design change or debugging purposes.

One embodiment uses the new flip-flop cells discussed herein in a scan chain test configuration. A scan chain uses several flip-flops connected in series to each other and is configured to operate in scan shift mode and capture mode. In the capture mode, testing is not performed, and flip-flops connected in series to each other are allowed to operate normally, synchronously passing data inputs to outputs and supplying those outputs to various logic and circuitry of the IC. In the scan shift mode, however, the flip-flops in the scan chain series are configured to pass a test input (instead of a normal data input) to their outputs, and a test flip-flop cell output is supplied to the next flip-flop cell in the scan chain series. The output of the final flip-flop in the series can be analyzed to determine how the particular logic or circuitry of the DUT is operating.

Embodiments are described herein in conjunction with illustrative techniques for arranging and using different flip-flop cells that include spare logic gates in an IC. Logic gates in the flip-flop cells may be wired as spare gates or to function normally (i.e., to disable one flip-flop cell output in capture or scan shift mode) by modifying one or more metallization layers, semiconductor layers, vias, connects, or the like. In one embodiment, spare inputs are convertible to normally functioning gates through changes in only a subset of an IC's semiconductor or metal layers, providing considerable simplification and cost savings in the design process.

It should be noted that the term "spare gate," as used herein, is intended to include, without limitation, a logic gate (e.g., AND, OR, NAND, NOR, XOR, XAND, or the like) or combinational logic (e.g., multiplexers, demultiplexers, inverters, programmable logic devices (PLDs) and the like). These logic gates and combination logic include, in various embodiments, spare inputs that are exposed to circuitry of the IC that is external to a flip-flop cell. Moreover, while embodiments discussed herein reference three-input NAND and NOR logic gates, alternative embodiments may include logic gates having any number of inputs (e.g., a 5, 10, or 20 logic gate).

The flip-flop cells have "permanent wiring" that is uniformly used for every replication of the flip-flop cell and "configurable wiring" that change between different replications of the flip-flop cell. Both types of wiring refer to pathways through the metallization layers that connect different logic and circuitry in the flip-flop cell. Specifically, permanent wiring refers to metallization and/or semiconductor layers, in every replicate flip-flop cell, used to connect a multiplexer to a flip-flop and an internal output of the flip-flop to one or more logic gates. Configurable wiring refers to connect metallization and/or semiconductor layers that can be configured in each instance of the replicate flip-flop cell to make logic gates or combinational logic therein function as either spare gates or as described herein in capture and scan shift modes. Thus, the configurable wiring in the IC may be used to set logic gates (NAND, NOR, etc.) or combinational logic (multiplexer, demultiplexer, etc.) in different instances of the replicate flip-flop cell to either disable flip-flop cell outputs (i.e., function in capture and scan shift modes) or provide a spare gate.

Before turning to the drawings, a couple of key points should be clarified. First, embodiments discussed herein refer to a flip-flop cells that internally include flip-flops, multiplexers, logic gates, and inverters. The flip-flops themselves have "internal" inputs and outputs themselves that are internal to the flip-flop cells. The flip-flop cells have inputs and outputs as well, and in particular, these outputs are referred to herein as "flip-flop cell outputs." For example, a flip-flop cell may have four flip-flop cell inputs and two flip-flop cell outputs while the cell's internal D flip-flop has an internal input and one or two internal outputs. To alleviate confusion, the D flip-flop's input and output will be referred to herein as the "internal" input and output of a flip-flop cell, and the flip-flop cell's inputs and outputs will be referred to as "flip-flop cell inputs and outputs."

Second, the flip-flop cells described herein may be replicated over and over on an IC. In other words, the IC may include numerous instances of the replicate flip-flop cells described in FIGS. 1A and 1B. In one embodiment, each replicate flip-flop cell includes a multiplexer to select either a data input or a test input, a flip-flop, and logic gates used to generate flip-flop cell outputs or to operate as spare gates. Replicate flip-flop cells all have the same logic and circuitry layout, whether it be the layout shown in FIG. 1A, the layout in FIG. 1B, or an alternative layout. For the sake of clarity, replicate flip-flop cells are discussed herein simply as "flip-flop cells," but it should be understood that some embodiments will include numerous instances of the flip-flop cells mentioned herein.

FIG. 1A illustrates a detailed representation of a flip-flop cell 10 that includes a flip-flop 12, multiplexer 14, NOR gate 16, and NAND gate 18. Flip-flop cell 10 receives data input D 20, test input TI 22, scan enable input TE 24, and clock input CP 26. Based on those four inputs, flip-flop cell 10 sets the internal flip-flop output signal Q(int) 36 to the current value of internal data input signal D(int) 32 after detection of a specific clock event at clock input CLK 34. NOR gate 16 and NAND gate 18 use Q(int) 36 and TE 24 to produce flip-flop cell output Q 28 and test flip-flop cell output TQ 30. One skilled in the art will appreciate and understand that clock events may include a rising edge, falling edge, toggle, or other similar action. Also, while NOR gate 16 and NAND gate 18 are shown as having three inputs, one skilled in the art will understand that different numbers of inputs may alternatively be used (e.g., 5-, 10-, 20-input NOR or NAND gate).

Flip-flop cell 10 operates in two different modes: capture mode and scan shift mode. Modes may be set and changed using scan enable input TE 24. In one embodiment, TE 24 is supplied to multiplexer 14 to select between D 20 and TI 22, depending on TE 24 signaling capture mode or scan shift mode, respectively. TE 24 is also provided to input B of NOR gate 16 and input F of NAND gate 18.

The multiplexed output of multiplexer 14 (i.e., either D 20 or TI 22, depending on which mode is currently being signaled) is provided to D(int) 32 of flip-flop 12, which, in one embodiment, is a D flip-flop. Alternative embodiments may use other types of flip-flops, such as SR flip-flops, JK flip-flops, and the like. Flip-flop 12 passes the multiplexed output to Q(int) 36 at the next clock event, and the multiplexed output of Q(int) 36 is supplied to gate inputs A (though inverted) of NOR gate 16 and input E of NAND gate 18. Moreover, reset input 38 provides a way to clear Q(int) 36 from an outside source. Spare inputs 41 and 42—which are supplied by gate inputs D and C, respectively—receive external signals from circuitry of an IC outside of flip-flop cell 12.

NOR gate 16 and NAND gate 18 operate to disable one of the flip-flop cell outputs of flip-flop cell 10 based on the different mode being signaled by TE 24. In capture mode, standard function flip-flop cell output Q 28 is kept enabled and test flip-flop cell output TQ 30 is disabled. Alternatively, in scan shift mode, TQ 30 is enabled and Q 28 is disabled. With respect to embodiments discussed herein, "disabling" a particular flip-flop cell output refers to setting that cell output to a particular value (such as "0" in some embodiments or "1" in other embodiments) and maintaining that value until TE 24 switches the flip-flop cell out of a current mode. For example, when capture mode is being signaled, TQ 30 may be set to 0 by NAND gate 18 and inverter 40 while Q 28 is allowed to switch and provide an active signal to other logic or circuitry in the IC. Conversely, when scan shift mode is being signaled, Q 28 may be set to 0 by NOR gate 16 while TQ 30 is allowed to switch and provide a test input to another flip-flop cell 10 in a scan chain sequence. Keeping one flip-flop cell output constant saves considerable power and current that would be expended as a result of continually switching the flip-flop cell output from one value to another as the D(int) 32 input changes. This also saves power that would be used downstream by logic and circuitry connected to the disabled flip-flop cell output.

NOR gate 16 and NAND gate 18, in operation, enable and disable Q 28 and TQ 30 based on the value of TE 24 signaling flip-flop cell 10 to operate in either capture mode or scan shift mode. NOR gate 16 and NAND gate 18 each have three inputs that can be used when either gate is wired as a spare gate. Inputs 41 and 42 may be driven to high and low states by coupling one to a voltage supply (Vdd) and the other to ground. When used in normal function (i.e., for capture or scan shift modes), spare inputs 41 and 42 are set to the appropriate logic level (1 or 0) in order to not disrupt the operation of gates 16 and 18. For example, spare input 42 may be set to 0 whenever logic gate 16 is wired to flip-flop 12, precluding spare output X of NOR gate 16 to be changed based on anything other than Q(int) 36 and TE 24. Spare inputs 41 and 42 are optional and therefore may not be included in all embodiments, or alternatively, there may be numerous spare inputs 41 and 42, thus exposing multi-input NOR and NAND gates—e.g., 5-input, 7-input, 10-input, etc.

Flip-flop cell 10 produces different cell outputs in capture and scan shift modes. When in capture mode, NOR gate 16 generates Q 28 according to the following table:

TABLE 1

Logic Table for
NOR Gate 16 in FIG. 1A

| Q(int)' | TE | Q |
|---|---|---|
| 0 | 0 | 1 |
| 0 | 1 | 0 |
| 1 | 0 | 0 |
| 1 | 1 | 0 |

Where Q(int)' represents Q(int) 36 after being inverted at NOR input A, TE represents TE 24 received at NOR input B, and Q represents flip-flop cell output Q 28 produced at NOR output X. Again, spare input 42 is optional, but when it is included, some embodiments may drive it to a particular logic state (e.g., 0) to stop spare input 42 from influencing output X of NOR gate 16.

When in scan shift mode, NAND gate 18 will generate TQ 30 according to the following table:

TABLE 2

Logic Table for
NAND Gate 18 in FIG. 1A

| Q(int) | TE | TQ' | TQ |
|---|---|---|---|
| 0 | 0 | 1 | 0 |
| 0 | 1 | 1 | 0 |
| 1 | 0 | 1 | 0 |
| 1 | 1 | 0 | 1 |

Where Q(int) represents Q(int) 36 received at NAND input E, TE represents TE 24 received at NAND input F, TQ' represents NAND output Y before being inverted to TQ 30 by inverter 40, and TQ represents flip-flop cell output TQ 30. Again, spare input 41 is optional, but when it is included, some embodiments may drive it to a particular logic state (e.g., 1) to stop spare input 41 from influencing output Y of NAND gate 18.

Some embodiments will expose NOR gate 16 or NAND gate 18 to external logic and circuitry outside of flip-flop cell 10, thus making inputs A-F and outputs X and Y available as spare gates. This is done, in some embodiments, by wiring the inputs and outputs of logic gates 16 or 18 to the external circuitry instead of to Q(int) 36, TE 24, and either Q 28 or TQ 30. For example, use of NAND gate 18 as a spare gate can occur by wiring input D, input E, input F, output Y, and the output of inverter 40 to external circuitry and directing Q(int) 36 out of flip-flop cell 10 as TQ 30. Logic gate 18 then becomes a spare gate that can be used in fixing bugs and with output Y—or the output from inverter 40—directed to circuitry being tested. The same procedure can be performed using logic gate 16 by connecting input A, input B, input C, and output X to external circuitry and directing Q(int) 36 out of Q 28. When logic gates 16 and 18 are being used as spare gates, some embodiments may lose the ability to disable Q 28 and TQ 30 because Q(int) 36 is directly passed as Q 28 or TQ 30.

In one embodiment, disconnecting inputs and outputs of logic gates 16 or 18 is performed by physically modifying metallization and/or semiconductor layers during IC fabrication. This may be done using different masks or otherwise modifying the polycrystalline (poly) layer, contact, inter-layer via, and numerous metallization layers. In a specific implementation, this is accomplished as a back-end-of-line (BEOL) process. To connect inputs of logic gates 16 or 18 (i.e., inputs A-C and X of logic gate 16 or inputs D-F of logic gate 18 and the output of inverter 40), one embodiment modifies a subset of mask layers. In one example, an IC with 40-50 layers may only need 10-15 layers modified, such as the poly layer, 5 or more metal layers, contact layers, and inter-layer vias. The logic gates in flip-flop cell 10 are thus fabricated to function as either spare gates or in a normal functioning manner—the latter simply meaning that the logic gates are set to receive Q(int) 36 and supply either Q 28 or TQ 30.

Figure 1B:
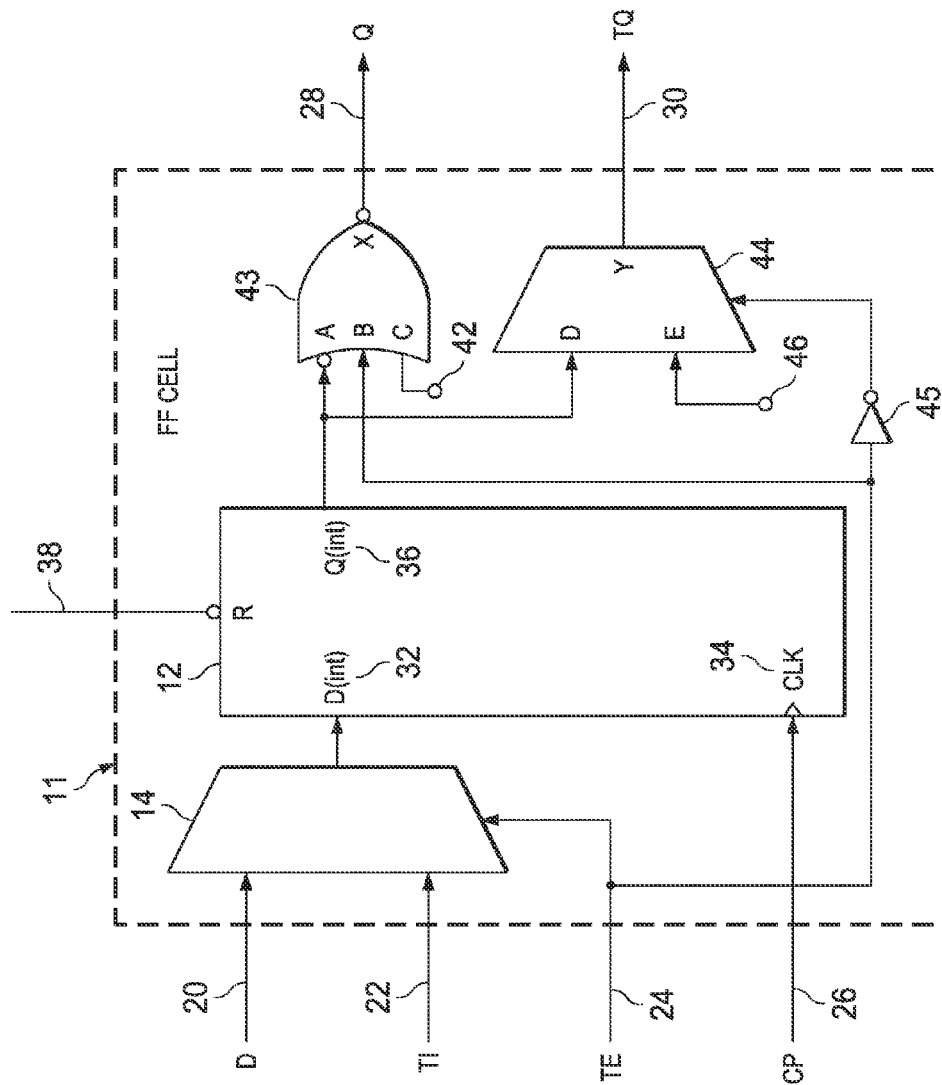
FIG. 1B illustrates a detailed representation of a flip-flop cell.

FIG. 1B illustrates a detailed representation of a flip-flop cell 11 that includes a flip-flop 12, multiplexer 14, NOR gate 43, and multiplexer 44. Flip-flop cell 11 receives data input D 20, test input TI 22, scan enable input TE 24, and clock input CP 26. Based on those four inputs, flip-flop cell 11 sets the internal flip-flop output signal Q(int) 36 to the current value of internal data input signal D(int) 32 after detection of a specific clock event at clock input CLK 34. NOR gate 43 and multiplexer 44 use Q(int) 36 and TE 24 to produce flip-flop cell output Q 28 and test flip-flop cell output TQ 30. To do so, in one embodiment, NOR gate 43 is supplied with an inversion of Q(int) 36 and TE 24, and multiplexer 44 is supplied with non-inverted Q(int) 36 and optionally with spare input 46 receiving an external signal. TE 24 is inverted by inverter 45 and supplied as the selector input of multiplexer 44. Multiplexer 44 passes Q(int) 36 during scan shift mode and passes input 46 during capture mode. Input 46 is connected to an external voltage or current signal.

While NOR gate 43 is shown as having three inputs, one skilled in the art will understand that different numbers of inputs may alternatively be used (e.g., 5-, 10-, 20-input NOR gate). Moreover, spare inputs 42 and 46 are optional, and in some embodiments will not be present in flip-flop cell 11.

In one embodiment, spare input 42 is driven to a low logic state and input 46 is driven to a high logic state when NOR gate 43 is connected to flip-flop 12, and is thus not being used as a spare gate. When either NOR gate 43 or multiplexer 44 are used as spare gates, their inputs and outputs are wired directly to circuitry of the IC, not to flip-flop 12. In other words, inputs A-E and outputs X and Y can be connected to circuitry external to flip-flop cell 11 when NOR gate 43 or multiplexer 44 are to be used as spare gates.

When in capture mode, NOR gate 43 operates to produce Q 28 according to the following logic table:

TABLE 3

Logic Table for
NOR gate 43 in FIG. 1B

| Q(int)' | TE | Q |
|---|---|---|
| 0 | 0 | 1 |
| 0 | 1 | 0 |
| 1 | 0 | 0 |
| 1 | 1 | 0 |

Where Q(int)' represents Q(int) 36 after being inverted at NOR input A, TE represents TE 24 received at NOR input B, and Q represents standard function flip-flop cell output Q 28 produced at NOR output X. While in scan mode, multiplexer gate 44 will generate flip-flop cell output TQ 30 according to the following table:

TABLE 4

Logic Table for Multiplexer 44 in FIG. 1B

| Q(int) | TE' | TQ |
|---|---|---|
| 0 | 0 | Q(int) |
| 0 | 1 | Input 46 |
| 1 | 0 | Q(int) |
| 1 | 1 | Input 46 |

Where Q(int) represents Q (int) 36 received at multiplexer input D, input 46 is received at multiplexer input E, TE' represents TE 24 after inversion by inverter 45, and TQ represents test flip-flop cell output TQ 30 produced at multiplexer output Y. In one embodiment, multiplexer 44 selects Q(int) 36 to pass as TQ 30 whenever TE 24 signals the scan shift mode—as indicated above whenever TE' is 0, and thus TE 24 is 1.

While flip-flop cell 11 is shown to include multiplexer 44, alternative embodiments may substitute different logic gates (e.g., AND, OR, inverter, etc.) or combinational logic for multiplexer 44. These alternative logic gates and combinational logic expose inputs 42 and 46 to ground, a voltage supply, or an external signal.

When used as a spare gate, logic gate 43 has inputs A and B and output X connected to circuitry instead of Q(int) 36, TE 24, and Q 28. In this configuration (i.e., when logic gate 43 is a spare gate), Q(int) 36 is directly supplied out as flip-flop cell output Q 28, and inputs A, B, C and output X can then be used as a spare gate by circuitry of the IC. Providing Q(int) 36 out as Q 28 will result in a flip-flop cell output that switches, but such switching is tolerated in order to gain access to a spare gate. Multiplexer 44 may also be exposed as a spare gate to external circuitry. In such a configuration, inputs D, E and the multiplexer output are provided to the external circuitry, and Q(int) 36 is directly supplied as TQ 30. As previously explained, logic gate 43 or multiplexer 44 can be transformed into a spare gate by modifying a subset of mask layers, metal layers, semiconductor layers, connects, and/or vias during IC fabrication. Again, in a specific implementation, this is accomplished during BEOL processing.

Figure 2:
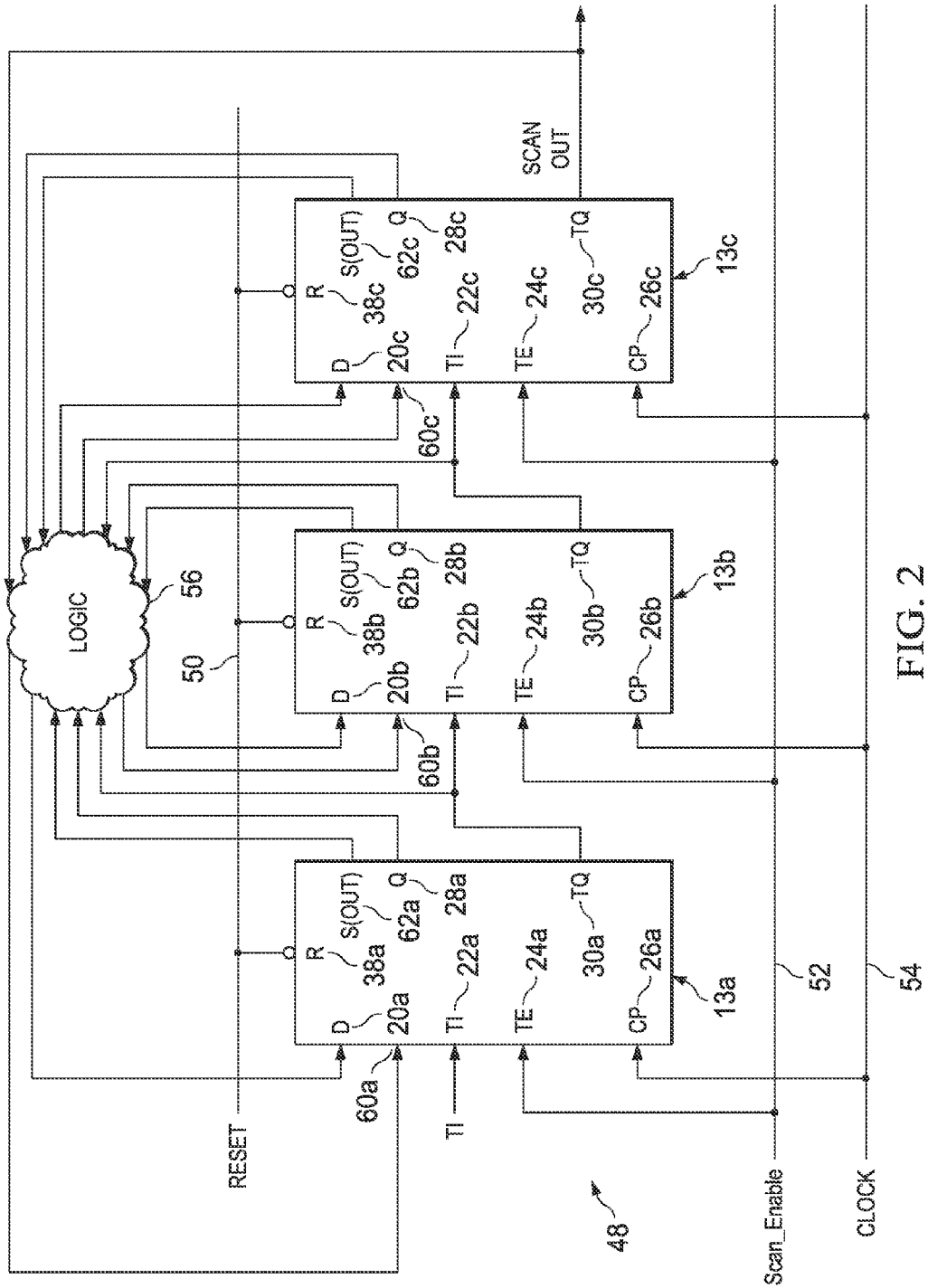
FIG. 2 illustrates a detailed representation of multiple flip-flop cells connected in a scan chain configuration.

FIG. 2 illustrates a detailed representation of multiple flip-flop cells connected in series to each other in a scan chain configuration. Design 48 includes three flip-flop cells 13a, 13b, and 13c. In one embodiment, cells 13a, 13b, and 13c each comprise flip-flop cell 10 illustrated in FIG. 1A. In another embodiment, cells 13a, 13b, and 13c each comprise flip-flop cell 11 illustrated in FIG. 1B. In another embodiment, cells 13a, 13b, and 13c comprise a combination of flip-flop cells 10 and 11. Each flip-flop cell in the scan chain sequence includes a data input D (20a, 20b, 20c); test input TI (22a, 22b, 22c); scan enable input TE (24a, 24b, 24c); clock input CP (26a, 26b, 26c); standard function flip-flop cell output Q (28a, 28b, 28c); and test output TQ (30a, 30b, 30c). While design 48 depicts three flip-flop cells 13 in a scan chain configuration, embodiments are not limited to just three flip-flop cells 13. Rather, the shown configuration is scalable and can include additional flip-flop cells 13.

Though not shown, flip-flop cells 13a, 13b, and 13c each include an internal flip-flop (e.g., D flip-flop 12); internal logic gates (e.g., NOR gate 16, NAND gate 18, NOR gate 43, or the like); and internal multiplexers (e.g., multiplexer 14 and/or multiplexer 44). For example, looking solely at flip-flop cell 13a, a multiplexer 14 may be used to select between data input D 20a or test input TI 22a using a scan enable signal supplied to TE 24a as the multiplexer's selector. In one embodiment, data input 20a is passed through multiplexer 14 when TE 24a signals capture mode, and test input TI 22a is passed through multiplexer 14 when TE 24a signals scan shift mode. Similar multiplexers 14 may also be included in flip-flop cells 13b and 13c.

Any of flip-flop cells 13a, 13b, and 13c may include configurable logic gates set to operate as spare logic gates. In this configuration, any or all of flip-flop cells 13a, 13b, and 13c may receive inputs signals from circuitry in Logic 56, which is external to the flip-flop cells 13 themselves, as spare gate inputs 60a, 60b, and 60c. These spare gates can operate to produce spare gate outputs S(out) 62a, 62b, and 62c that are provided back out to circuitry in Logic 56. Some embodiments will only configure a certain number of flip-flop cells 13 to include spare gates. For example, flip-flop cell 13a may be set to receive spare inputs 60a and produce S(out) 62a while flip-flop cells 13b and 13c are configured to use their logic gates to disable one of their flip-flop cell outputs (Q or TQ).

Logic 56 represents various circuitry and/or storage elements that supply and receive data signals from flip-flop cells 13a, 13b, and 13c. Such circuitry and storage elements may be incorporated into one or more electronic devices, such as computer, server, tablet, smartphone, or the like. In particular, the shown logic may include various circuit components (e.g., resistors, capacitors, inductors, etc.); logic gates (e.g., AND, OR, NAND, NOR, etc.); microcontrollers and microprocessors; ICs; systems on chip (SoC), etc. Storage elements may include storage drives, hard drives, memory, field programmable gate arrays (FPGAs), application specific integrated circuits (ASICs), programmable logic arrays (PLAs) and programmable array logics (PALs), complex programmable logic devices (CPLDs), hardware registers, volatile and non-volatile memory, random access memory (RAM), read-only memory (ROM), electrically erasable programmable ROM (EEPROM), and the like. Such circuitry and storage elements will generally be understood by those skilled in the art, and therefore need not be discussed at length herein.

Reset lines 38a, 38b, 38c are each coupled to reset bus 50 that, in operation, sends a signal to reset the flip-flops in flip-flop cells 13a, 13b, and 13c. Clock inputs CP 26a, 26b, and 26c are each coupled to clock line 54, which provides a clock signal. Scan enable signal inputs TE 24a, 24b, and 24c are each coupled to a scan enable line 52 that provides a scan enable signal to switch flip-flops in flip-flop cells 13a, 13b, and 13c into either capture mode or scan shift mode. The scan enable signal may be switched from capture mode to scan shift mode manually by a user or automatically by a computing device or component thereof.

When triggered in scan shift mode flip-flop cells 13a, 13b, and 13c are configured to deny data inputs 20a, 20b, and 20c while passing test inputs TI 22a, 22b, and 22c through their respective flip-flop cells 13. Initial test input TI 22a represents an input signal from either another flip-flop cell 13 or some other source, such as a test signal provided by a user or from an electronic tester. Embodiments may supply TI 22a with a signal that can be manipulated by a user (e.g., using a computing device, current source, or the like) or a signal that provides some predetermined testing pattern, like a square wave of a particular frequency.

Also while in scan shift mode, test inputs 22a, 22b, and 22c (or inversions thereof) are passed to test flip-flop cell outputs TQ 30a, 30b, and 30c. Test flip-flop cell outputs TQ 30a and 30b are supplied to test inputs TI 22b and 22c. Standard function flip-flop cell outputs Q 28a, 28b, and 28c are supplied to Logic 56. The scan output from the final flip-flop in the scan chain (shown as TQ 30c) is supplied to a storage element, hardware register, or the like where it can be stored, analyzed, and or displayed to a user to determine whether a particular DUT in Logic 56 is functioning properly.

When in capture mode, test flip-flop cell outputs TQ 30a, 30b, and 30c are each disabled by logic gates in flip-flop cells 13a, 13b, and 13c, respectively, driving these test flip-flop cell outputs to a particular value (e.g., 0, low, etc.). Also, standard function flip-flop cell outputs Q 28a, 28b, and 28c are allowed to supply signals to Logic 56. When in scan shift mode, Q 28a, 28b, and 28c are each disabled by logic gates in flip-flop cells 13a, 13b, and 13c, driving these standard function flip-flop cell outputs to a particular value (e.g., 0, low, etc.). Also, TQ 30a, 30b, and 30c are supplied as test inputs TI 22 of the next flip-flop cell 13 in the scan chain sequence, with the last flip-flop cell 13c providing a final scan output 64 to a memory element for storage and eventual display to a user.

Selective disablement of flip-flop cell outputs Q 28a, 28b, and 28c and TQ 30a, 30b, and 30c reduces overall power consumption without sacrificing performance. Standard function flip-flop cell outputs Q 28a, 28b, and 28c are unnecessary during scan shift mode, and test flip-flop cell outputs TQ 30a, 30b, and 30c are unnecessary during capture mode. So there is no reason to allow the unnecessary flip-flop cell outputs to switch signals in modes where they are not relevant.

Figure 3:
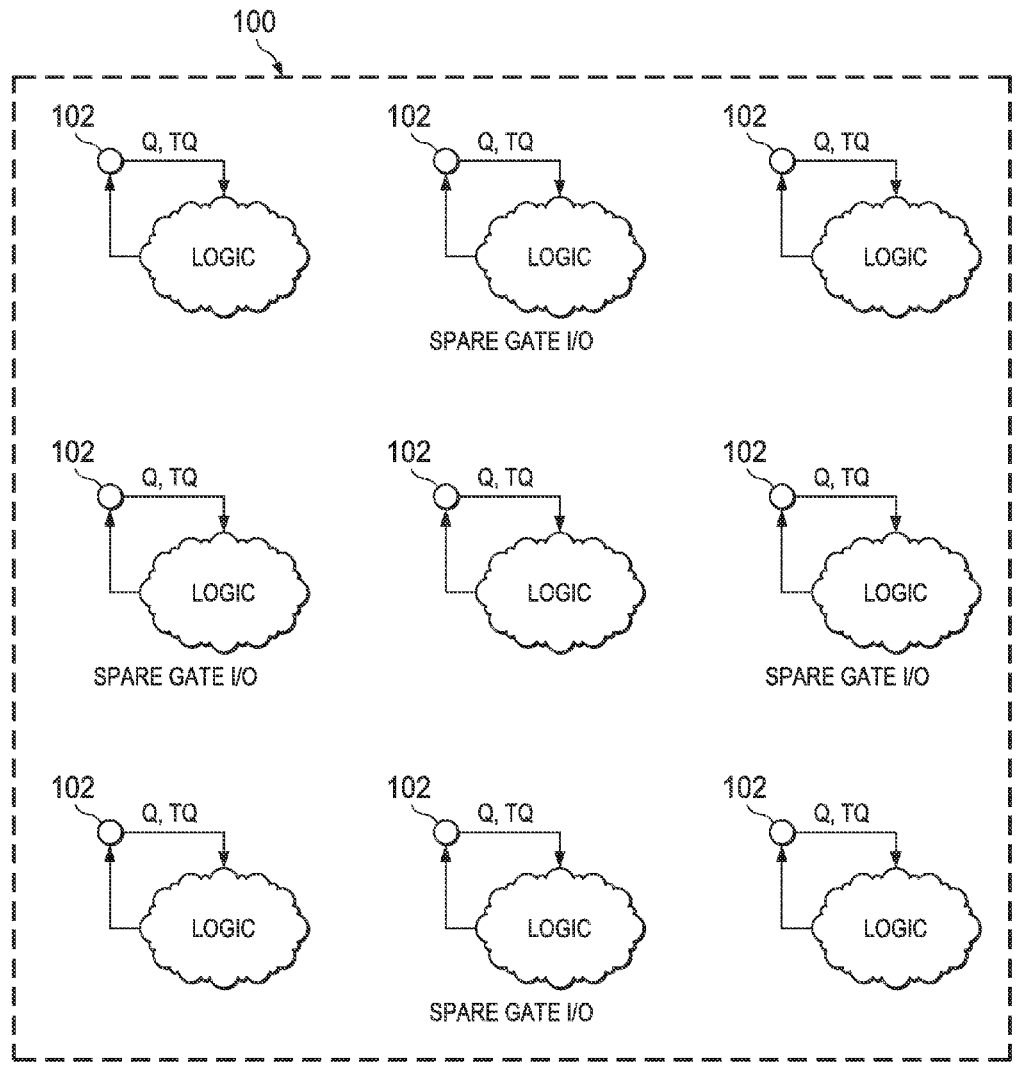
FIG. 3 illustrates a topside view of a semiconductor layer of an IC.

FIG. 3 illustrates a uniform pattern for dispersing replicate flip-flop cells 102 across a semiconductor layer 100 (e.g., silicon dioxide) of an IC. Though marked with the same reference number, replicate flip-flop cells 102 may comprise flip-flop cell 10, flip-flop cell 11, or a combination thereof. In one embodiment, each replicate flip-flop cell 102 includes a configurable logic gate that can be used as a spare gate through manipulation of different metallization and/or semiconductor layers. During fabrication, the spare gates can be uniformly distributed across an IC by configuring a certain number of replicate flip-flop cells 102 to include spare logic gates that expose spare gate inputs and outputs (I/O) to other circuitry of the IC. Different embodiments may distribute the spare gated flip-flop cells 102 differently. For example, every other (or third, fourth, fifth, etc.) replicate flip-flop cell 102 may be configured in the spare gate configuration.

Moreover, flip-flop cells 102 may be connected to each other in the scan chain configuration depicted in FIG. 2. In this configuration, test flip-flop cell outputs TQ 30 are supplied as test inputs TI 22 to the next flip-flop cell 10 or 11 in a sequence, and standard function flip-flop cell outputs Q 28 are supplied to other logic (e.g., Logic 56).

It should be appreciated that the various embodiments disclosed herein are exemplary. Accordingly, various modifications to these embodiments may be made without departing from the scope of the present disclosure and the claims provided below. For example, although one embodiment is generally directed to an IC with multiple new flip-flop cells connected in series to other applications may apply as well.

The subject matter of the present invention is described with specificity herein to meet statutory requirements. The description itself is not, however, intended to limit the scope of this patent. The claimed subject matter might also be embodied in other ways, to include different steps or combinations of steps similar to the ones described herein, in conjunction with other present or future technologies.

What is claimed is:

1. An integrated circuit, comprising:
   a first replicate flip-flop cell comprising:
      a first multiplexer configured to receive a first data input, a first test input, and a selection signal and provide a first multiplexed output,
      a first flip-flop configured to generate a first internal data signal based on the first multiplexed output and a clock signal, and
      a first logic gate configured to generate a first flip-flop cell output in response to the first internal data signal and the selection signal, wherein said first flip-flop cell output is set to a fixed logic value if the selection signal is set to a first logic state and is permitted to change state in response to the first internal data signal if the selection signal is set to a second logic state; and
   a second replicate flip-flop cell comprising:
      a second multiplexer configured to receive a second data input, a second test input, and the selection signal and provide a second multiplexed output,
      a second flip-flop configured to generate a second internal data signal based on the second multiplexed output and the clock signal, and
      a spare logic gate configured to receive one or more inputs from circuitry external to the second replicate flip-flop cell and generate a spare gate output in response to the one or more inputs from the circuitry external to the second replicate flip-flop cell.

2. The integrated circuit of claim 1, wherein the first logic gate is selected from an AND gate, an OR gate, a NAND gate, and a NOR gate.

3. The integrated circuit of claim 1, wherein the spare logic gate is selected from an AND gate, an OR gate, a NAND gate, a NOR gate, and a third multiplexer.

4. The integrated circuit of claim 1, wherein the first replicate flip-flop cell further comprises a second logic gate configured to generate an additional flip-flop cell output in response to the first internal data signal and the selection signal, wherein said additional flip-flop cell output is set to the fixed logic value if the selection signal is set to the second logic state and is permitted to change state in response to the first internal data signal if the selection signal is set to the first logic state.

5. The integrated circuit of claim 4, wherein the first logic gate and the second logic gate each comprise a spare input that is connected to either a voltage supply or ground in response to the selection signal.

6. The integrated circuit of claim 4, wherein the first logic gate and the second logic gate each comprise at least one member of a group comprising an AND gate, an OR gate, a NAND gate, a NOR gate, and a multiplexer.

7. The integrated circuit of claim 4, wherein the additional flip-flop cell output is supplied to the second replicate flip-flop cell as the second test input.

8. The integrated circuit of claim 1, wherein the first flip-flop cell output is supplied to a design under test of the integrated circuit.

9. The integrated circuit of claim 1, wherein the first flip-flop and the second flip-flop are both D flip-flops.

10. An integrated circuit, comprising:
   a flip-flop cell including:
      a multiplexer configured to receive a data input, a test input, and a selection signal and provide a multiplexed output;
      a flip-flop configured to generate an internal data signal based on the multiplexed output and a clock signal; and a logic gate configurable to operate:
  a) as a first logic gate configured to generate a first flip-flop cell output in response to the internal data signal and the selection signal, said first flip-flop cell output set to a fixed logic value if the selection signal is set to a first logic state and permitted to change state in response to said internal data signal if the selection signal is set to a second logic state, and
  b) as a spare logic gate configured to receive one or more inputs from circuitry external to the flip-flop cell and generate a spare gate output in response to the one or more inputs from the circuitry external to the flip-flop cell.

11. The integrated circuit of claim 10, further comprising an additional logic gate configured to generate a second flip-flop cell output in response to the internal data signal and the selection signal, said second flip-flop cell output set to the fixed logic value if the selection signal is set to the second logic state and permitted to change state in response to said internal data signal if the selection signal is set to the first logic state.

12. The integrated circuit of claim 11, wherein the additional logic gate is selected from an AND gate, an OR gate, a NAND gate, a NOR gate, and a multiplexer.

13. The integrated circuit of claim 10, wherein the logic gate is selected from an AND gate, an OR gate, a NAND gate, a NOR gate, and a multiplexer.

14. The integrated circuit of claim 10, wherein the logic gate is configurable to operate as one of the first logic gate and the spare logic gate by modifying one or more metallization layers of said integrated circuit.

15. The integrated circuit of claim 10, wherein the logic gate receives an external input that is coupled to a voltage supply or ground.

16. The integrated circuit of claim 10, wherein the flip-flop is a D flip-flop.

17. An integrated circuit having a plurality of metallization layers, comprising:
  a plurality of replicate flip-flop cells that each include a multiplexer, a flip-flop, a logic gate, and a flip-flop cell output;
  permanent wiring, implemented in the metallization layers, configured to connect, in each of the replicate flip-flop cells, the multiplexer to the flip-flop and an internal output of the flip-flop to the logic gate; and
  configurable wiring, implemented in the metallization layers, configured to provide connections according to the following:
    in a first replicate flip-flop cell of the plurality of replicate flip-flop cells, connect the internal output of the flip-flop to an input of the logic gate and provide an output of the logic gate as the flip-flop cell output, and
    in a second replicate flip-flop cell of the plurality of replicate flip-flop cells, connect circuitry that is external to the second replicate flip-flop cell to inputs of the logic gate and direct an output of the logic gate to the external circuitry.

18. The integrated circuit of claim 17, wherein the plurality of replicate flip-flop cells are connected in series in a scan chain configuration such that test flip-flop outputs of the plurality of replicate flip-flop cells are coupled to test inputs of the plurality of replicate flop-flop cells.

19. The circuit of claim 17, wherein the logic gate comprises one of an AND gate, an OR gate, a NAND gate, a NOR gate, and a multiplexer.

20. The circuit of claim 17, wherein the first replicate flip-flop cell is configured to generate the flip-flop cell output in response to the internal output of the flip-flop and a selection signal, wherein said first replicate flip-flop cell output is set to a fixed logic value if the selection signal is set to a first logic state and is permitted to change state in response to said internal output if the selection signal is set to a second logic state.

* * * * *